United States Patent [19]

Maggelet et al.

[11] Patent Number: 5,099,391
[45] Date of Patent: Mar. 24, 1992

[54] HOUSING FOR A RACK MOUNTABLE POWER SUPPLY FOR USE WITH A PROGRAMMABLE LOGIC CONTROLLER

[75] Inventors: John Maggelet, Sussex; Robert J. Rammel, Muskego, both of Wis.

[73] Assignee: Square D Company, Palatine, Ill.

[21] Appl. No.: 635,050

[22] Filed: Dec. 28, 1990

[51] Int. Cl.⁵ .......................... H05K 7/10; H05K 1/14
[52] U.S. Cl. ....................................... 361/395; 439/76; 361/415
[58] Field of Search ............... 361/340, 380, 390, 391, 361/392, 393, 394, 395, 399, 413, 415; 439/76, 79, 59, 60, 61, 62

[56] References Cited

U.S. PATENT DOCUMENTS

| | | | |
|---|---|---|---|
| 4,226,491 | 10/1980 | Kazama et al. | 361/399 X |
| 4,672,511 | 6/1987 | Meusel et al. | 361/380 X |

FOREIGN PATENT DOCUMENTS

| | | | |
|---|---|---|---|
| 2704671 | 8/1978 | Fed. Rep. of Germany | 361/380 |
| 2709707 | 9/1978 | Fed. Rep. of Germany | 361/415 |
| 759446 | 10/1956 | United Kingdom | 361/415 |

OTHER PUBLICATIONS

IBM Technical Disclosure Bulletin, vol. 30, No. 12, May, 1988, pp. 348-352, "Method and Design for Mounting a Printed Circuit Board in a Housing".

*Primary Examiner*—Gerald P. Tolin
*Assistant Examiner*—Michael W. Phillips
*Attorney, Agent, or Firm*—Michael J. Femal

[57] ABSTRACT

A housing for enclosing a power supply circuit board assembly of the type used in programmable logic controllers is disclosed. Through the use of an adapter plate, the housing can accommodate a wide variety of power supply circuit boards that have multiple input and output components that must be accessible to the outside of the housing. Incoming power is supplied through a terminal block on the front of the housing and output power is presented to an edge connector for supplying control voltages directly to the backplane of a programmable logic controller. A hinged side wall provides easy access to the power supply circuit board and the components on it and slots on the top and bottom of the housing provide venting for cooling the components.

6 Claims, 6 Drawing Sheets

HOUSING FOR A RACK MOUNTABLE POWER SUPPLY FOR USE WITH A PROGRAMMABLE LOGIC CONTROLLER

FIELD OF THE INVENTION

Applicants' invention relates generally to electrical control mechanisms and more particularly to a housing adaptable for use with a power supply contained on a circuit board that supplies control voltages for a programmable logic controller that performs a number of control functions.

RELATED APPLICATIONS

This application is related to commonly assigned pending application to Maggelet et al., Ser. No. 325,414, now U.S. Pat. No. 4,956,750, entitled "A Register Rack Assembly for a Programmable Controller System", the specifications of which are expressly incorporated herein.

BACKGROUND OF THE INVENTION

Circuit boards supporting a plurality of interconnected electric components to provide a variety of control voltages are well known. In many instances, these power supply assemblies supply the operating voltages for other circuit boards that are electrically interconnected in a rack assembly to form a programmable logic controller (PLC) that is normally used to control a number of functions in a manufacturing operation. This programmable logic controller is often of necessity located on the plant floor and thus is subject to considerable abuse.

The circuit boards of the power supply module are made of a nonmetallic material and are normally mounted in a sturdy housing external to the PLC. These assemblies are generally bulky and require mounting space. Further, wiring is required between the power supply and the PLC rack assembly. The circuit boards typically have various input/output devices must be outwardly exposed to permit operator monitoring and/or actuation. For example, circuit boards of this type can have an on-off switch, fuse holder, terminal blocks, battery, and a plurality of light emitting diodes (LEDs) that are outwardly exposed through windows formed in the housing wall. The on-off switch provides secured operation of the PLC. The terminal blocks are used for field wiring of input or output voltages. The LEDs provide a visual indication of the operation of the circuit board. In addition, the fuse provides protection from overloads of the supply voltages. The battery provides backup voltages for critical components in the PLC if a power outage occurs.

It is also well known that the circuit boards require frequent replacement when a malfunction occurs. Since a malfunction of necessity shuts down the machine operation, replacement must be made in a minimum amount of time.

The present invention provides a simplified rack mountable housing construction which easily accommodates the power supply circuit boards and also provides a novel cover which can be opened quickly to gain access to the electrical components on the circuit board.

SUMMARY OF THE INVENTION

According to the present invention, the circuit board housing has a base or bottom wall, side walls, a front wall and a top wall segment that cooperate to define a rearwardly opening channel. The front wall has an opening for mounting an adapter plate. The adapter plate can have a plurality of windows or openings for exposing a plurality of input/output devices that may be present on the circuit board. The front wall has further openings at the top for exposing a multitude of LEDs that may also be present on the circuit board. A rearwardly open channel allows an edge of the circuit board with conductive patterns to extend through the housing and plug into an edge connector in the PLC rack assembly to provide the electrical connection between the power supply and the backplane of the PLC.

The left side wall has press-fit metal standoffs that are strategically spaced. The circuit board has mounting holes that respectively engage the metal standoffs to provide a reliable and secure mounting means of the circuit board to the housing. The right side wall is hinged to the bottom wall and is secured to the rest of the housing by three fasteners after the circuit board has been mounted.

According to one aspect of the invention, the adapter plate has a first opening which receives a terminal block, a second opening for access to a fuse holder, a third opening which receives an on-off switch, a fourth opening for receiving status LED indicators and a fifth and sixth opening for receiving a plug that could be used for interconnection to other PLC rack assemblies. A battery cover plate includes a tab which is received under an edge of the left side of an opening in the adapter plate and is retained at the right side of the opening by a single fastener. The adapter plate is secured to the front side of the housing by two fasteners to complete the assembly.

DESCRIPTION OF THE PREFERRED EMBODIMENT

Figure 1:
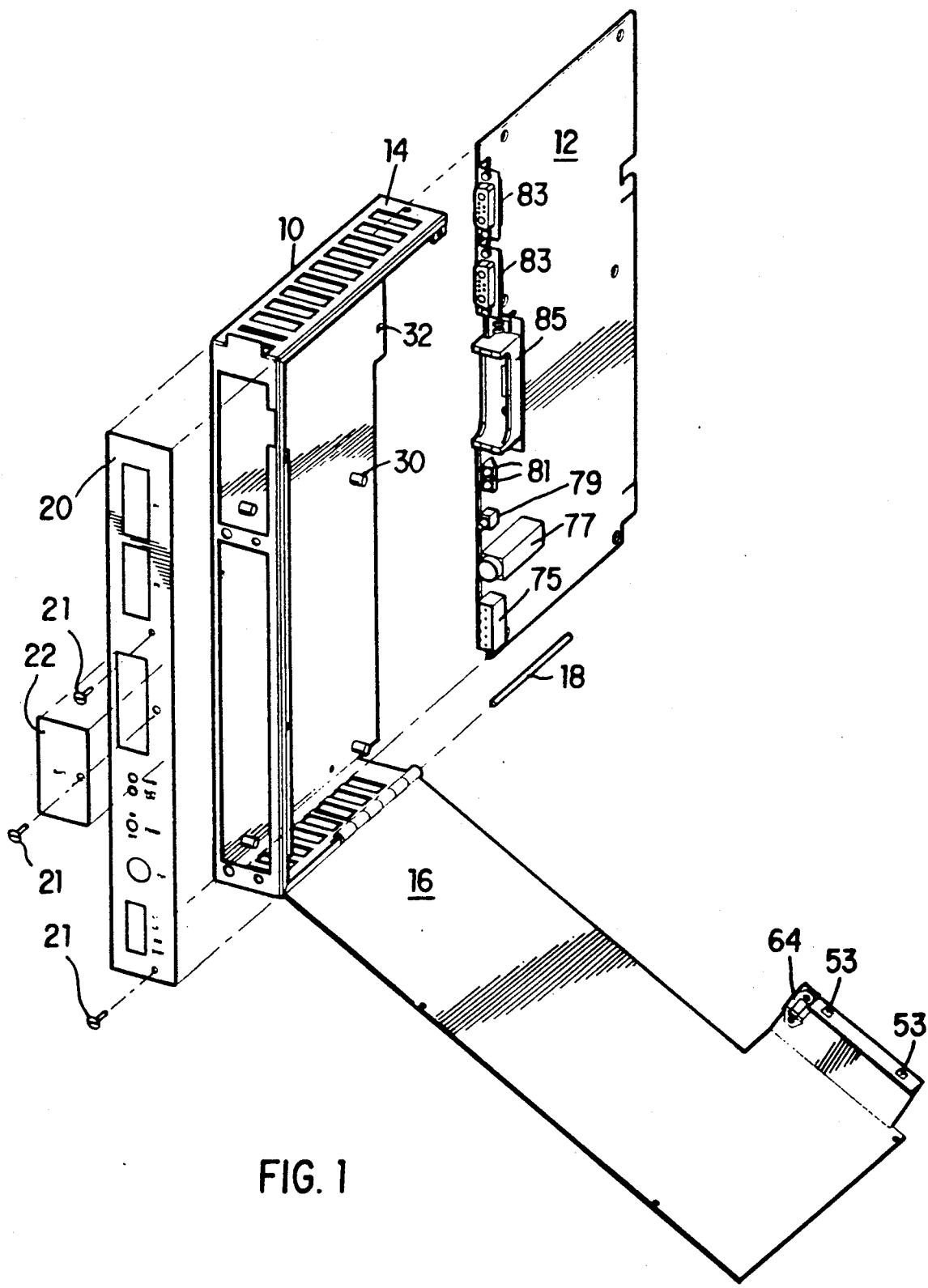
FIG. 1 is an exploded perspective view of the housing for a rack mountable power supply constructed in accordance with the teachings of the present invention.

Referring to FIG. 1 of the drawings, a housing 10 encloses a power supply circuit board assembly 12 of the type used in a typical programmable logic controller system is disclosed. The housing 10 includes two major pieces, a left side wall 14 and a right side wall 16 is hinged to the left side wall 14 by pin 18. An adapter plate 20 is secured to the front portion of the left side wall 14 by fasteners 21 and a battery cover 22 closes an opening in the adapter plate 20, being secured by another fastener 21. Identification of the various input/output devices mounted on the power supply circuit board 12 could be silkscreened on the adapter plate 20 or an optional nameplate (not shown) could also be used. The details of the left side wall 14 and right side wall 16 will be described next.

Figure 2:
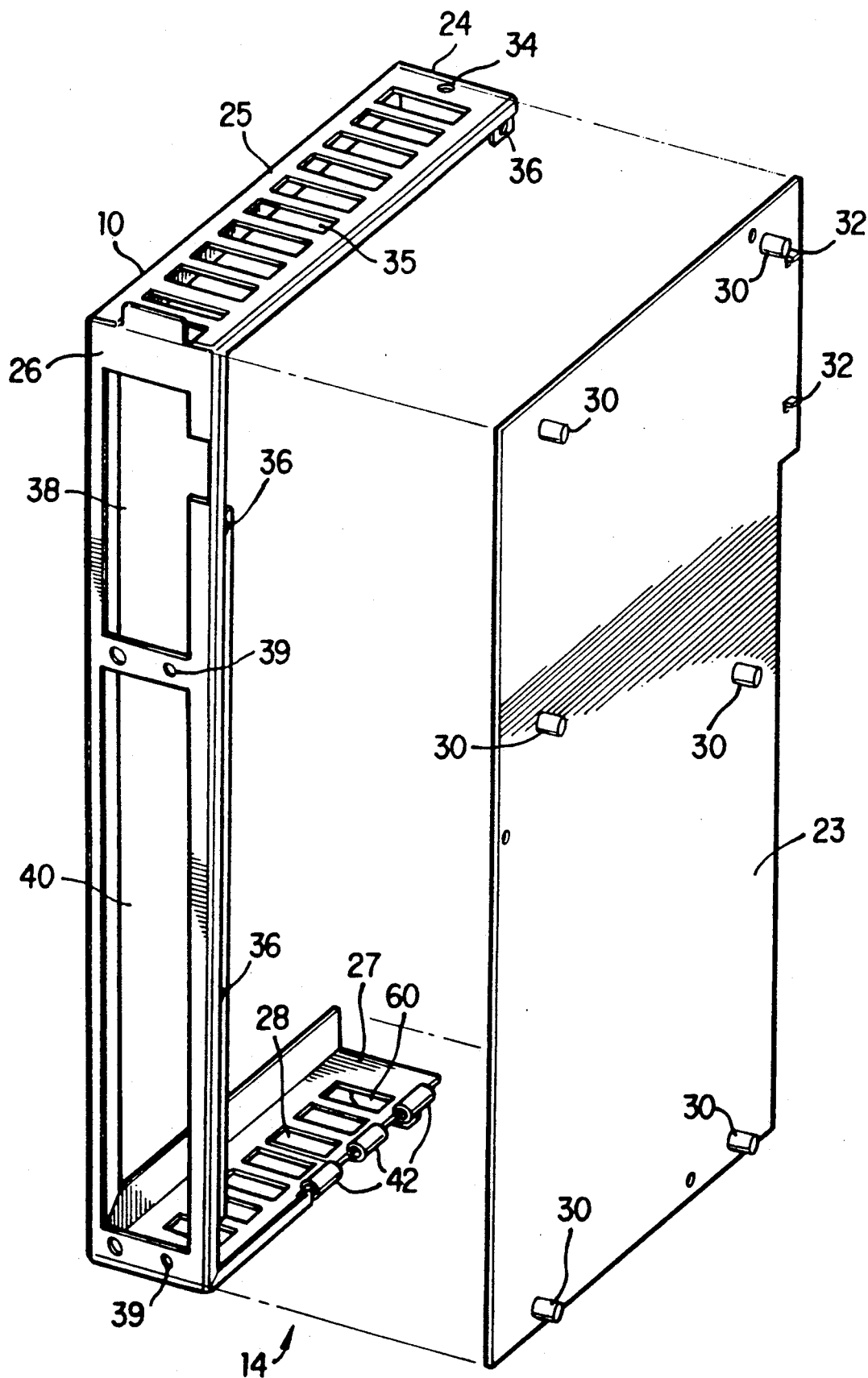
FIG. 2 is a side view of the left side wall, front wall, top wall, and bottom wall.

Referring now to FIG. 2, the left side wall 14 consists of a back side 23 that forms the left side of the housing 10 and a formed U-shaped channel 24 that is blind spot-welded to the back side 23. The formed U-shaped channel 24 has a top wall segment 25, a front wall segment 26, and a bottom wall segment 27. Six metal standoffs 30 that are used for supporting circuit board 12 are press-fit into the back side 23. Two locating tabs 32 provide means for aligning right side wall 16 to the left side wall 14 during final assembly. Top wall segment 25 has mounting hole 34 which provides a means to secure the completed housing 10 in its final environment which will be described later. Slots 35 provide venting means to cool components that are located on power supply circuit board assembly 12. Mounting holes 36 located on top wall segment 25, and front wall segment 26, accept the fasteners 21 that secure the right side wall 16 to the left side wall 14. Slot 38 of top portion of segment 26 provides an opening for connectors that may be present on the power supply circuit board assembly 12 for interconnection with other PLC rack assemblies. Mounting holes 39 accept a screw type fastener 21 to secure the adapter plate 20 the the housing 10. Opening 40 on the bottom portion of front segment 28 accommodates a multitude of different input/output devices that may be present on the power supply circuit board assembly 12. Three tabs 42 of bottom segment 27 are cylindrically formed to define one half of a hinged member to mate with a similar portion of right side wall 16. Slots 28 provide intake air for cooling the components on the power supply circuit board assembly 12.

Figure 3:
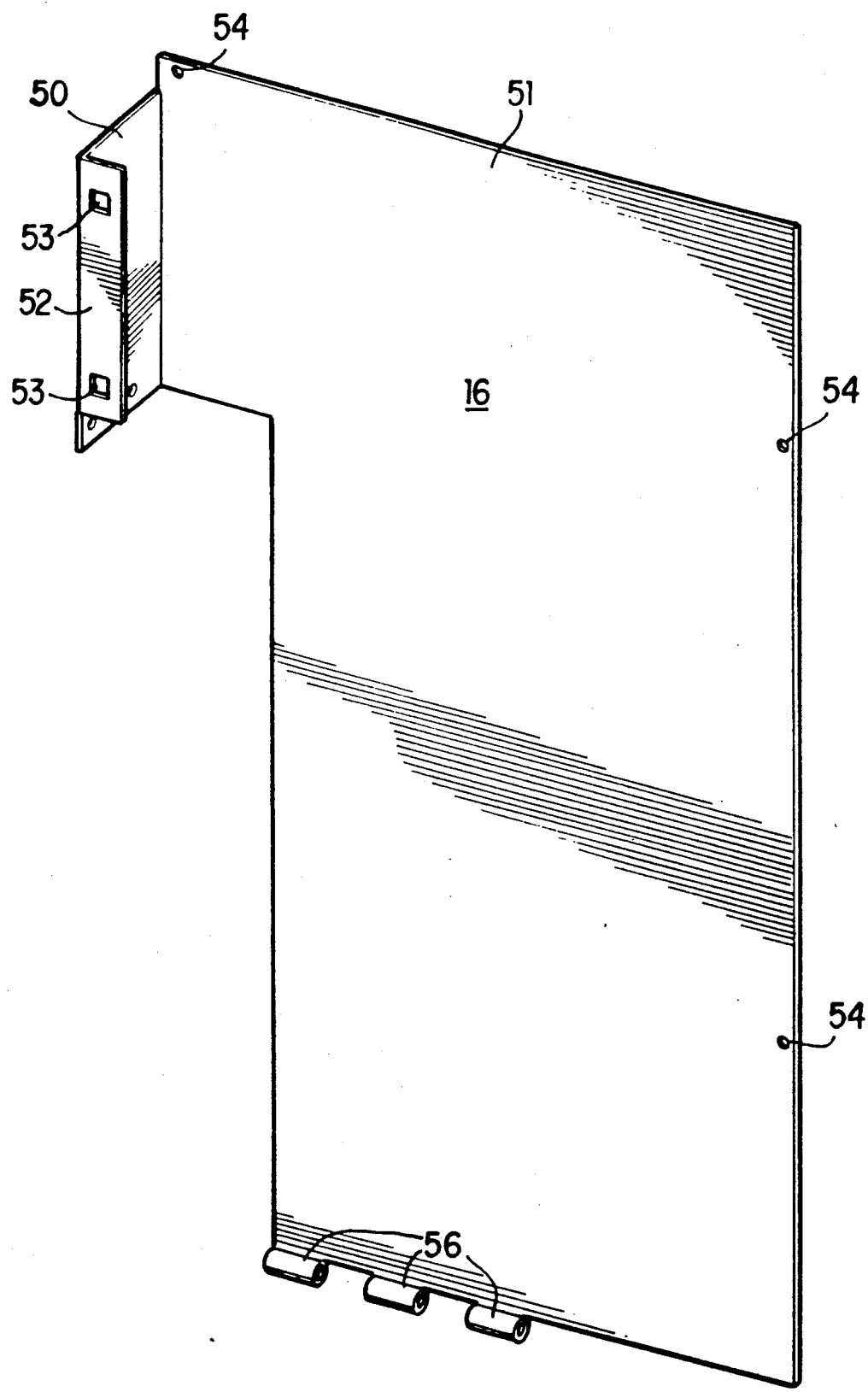
FIG. 3 is a side view of the hinged right side wall.

FIG. 3 is a detailed side view of right side wall 16. Segment 50 is perpendicular to the section 51 and forms the rear segment of housing 10. A flange 52 has two rectangular openings 53 that are positioned to accept tabs 32 of left side wall 14 in final assembly. Holes 54 line up with holes 36 of left side wall 14. Three tabs 56 are cylindrically formed to define the other half of a hinged member to mate with a similar portion of left side wall 14.

Figure 4:
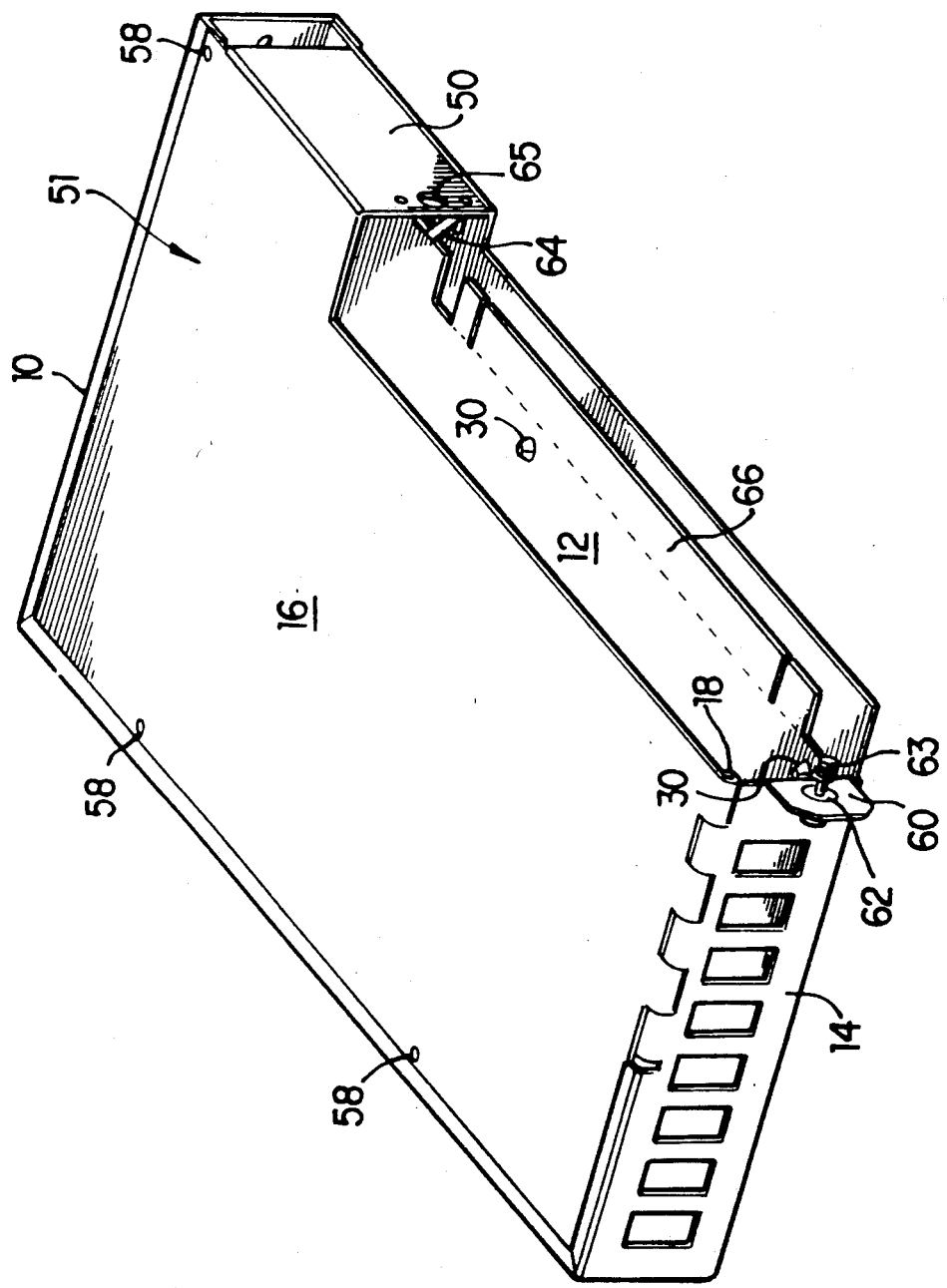
FIG. 4 is a side view of the housing showing details of the rearwardly opening channel.

In addition to the pin 18, the right side wall 16 is attached to the left side wall 14 by three mounting screws 58 through holes 36 and 54 respectively, after the power supply circuit board assembly 12 is secured to the left side wall 14 by metal mounting standoffs 30 as illustrated by FIG. 4. Metal standoffs 30 are spaced on left side wall 14 so as to insure alignment of input/output components on power supply circuit board assembly 12 with their respective openings or windows on adapter plate 20. Hole 62 of downward tab 60 accepts a screw 62 for securing the housing 10 into a rack assembly (not shown) of the type in commonly-assigned, pending application to Maggelet et al., Ser. No. 325,414, now U.S. Pat. No. 4,956,750 entitled "A Registered Rack Assembly for a Programmable Controller System". A ball clip connector 64 is mounted next to hole 65 of segment 50 and is positioned to accept a part of the referenced rack assembly for further securing and alignment of the housing 10 to the rack assembly. Edge 66 of power supply circuit board assembly 12 contains the conductive patters that mate with a commonly obtained and recognized edge connector in the rack assembly which allows the power supply housing 10 to be electrically connected and supply control voltages to other modules to form a programmable logic controller.

Figure 5:
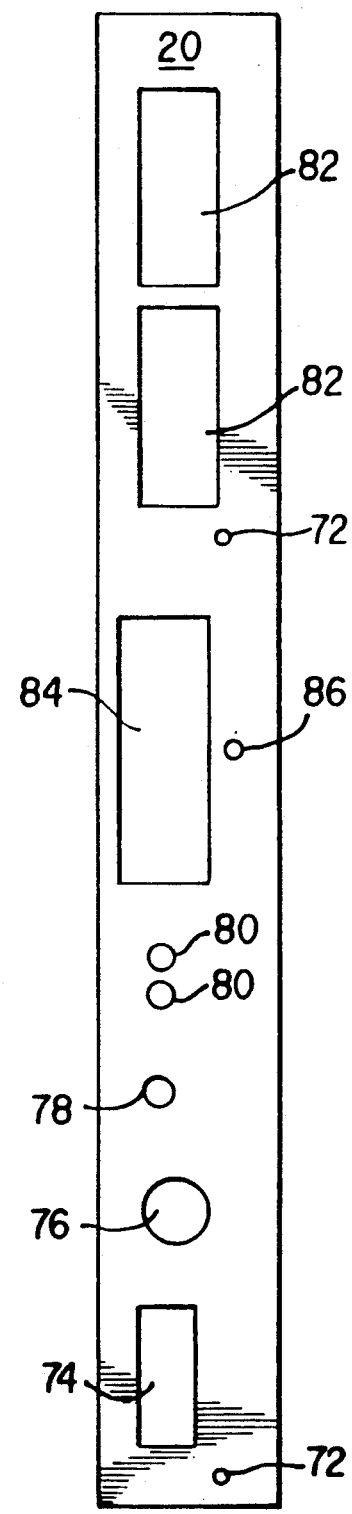
FIG. 5 is a front view of the front adapter plates.

Referring now to FIG. 5, the adapter plate 20 is illustrated. Holes 72 provide clearance for a screw type fastener 21 to secure the adapter plate 20 to the lower front wall 26 through mounting holes 39. Other openings in the adapter plate 20 expose a plurality of input/output devices that are present on power supply circuit board assembly 12. Elongated opening 74 provides clearance for the terminal block 75. Terminal block 75 provides the means for connecting the input power source for the power supply module 10. Hole 76 provides the clearance for fuse holder 77 that permits replacement of a fuse that provides protection for the power supply circuitry. Power on-off switch 79 is accessed through opening 78. Holes 80 provide openings for the power supply status indicators 81.

If the power supply assembly is to supply additional power outside of the referenced rack assembly, connectors 83 are supplied as a means to provide connectivity. Connectors 83 are accessed through elongated openings 82. Power supplies often have battery backup systems. Rectangular opening 84 provides accessibility to battery holder 85. The battery cover 22 is secured to the adapter plate 20 by fastener 21 through clearance hole 86.

Figure 6:
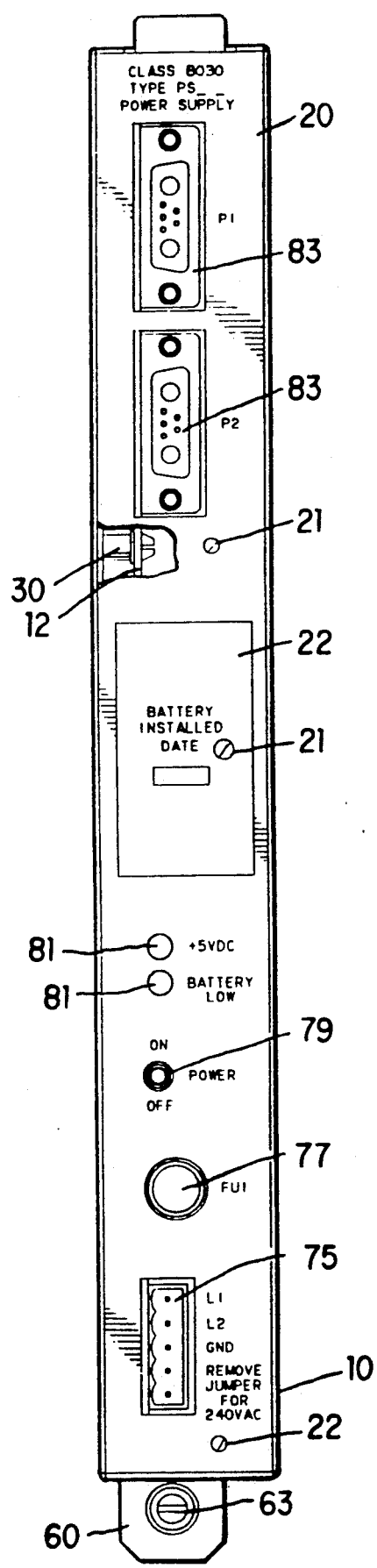
FIG. 6 is a front view with parts broken away showing the front wall of the housing.

According to one aspect of the invention, the housing is configured such that the input/output devices are as shown in FIG. 6. Cutaway view shows in greater detail the attachment of power supply circuit board assembly 12 to the left side wall 14 by the metal mounting standoffs 30.

While the specific embodiments have been illustrated and described, numerous modifications are possible without departing from the scope or spirit of the invention.

What we claim is:

1. A housing including a power supply circuit board assembly, the housing comprising:
   (a) a left side wall having a base, a front wall, and a top wall;
   (b) a removable right side wall hinged to said base of said left side wall, said right side wall having spaced slots and said left side wall having projections received into said slots so that said right side wall can be positioned over said left side wall;
   (c) fastener means for releasably retaining said right side wall on said left side wall;
   (d) said power supply circuit board assembly secured to said left side wall and having a plurality of components thereon, said components functioning as input or output devices and are externally exposed through said housing, said left side wall including locator means alignably positioning said circuit board within said housing;
   (e) an adapter plate disposed on said front wall, said front wall having opening receiving said components with means for maintaining alignment between said openings and said components, and said adapter plate having a plurality of windows and additional openings exposing a plurality of said components; and
   (f) a battery cover disposed on said adapter plate.

2. The housing as defined in claim 1 wherein said right side wall functions as a door for quick access for removal of said power supply circuit board or of said components on said power supply circuit board.

3. The housing as defined in claim 1 where in said battery cover functions as a door for quick access for removal of a battery on said power supply circuit board.

4. The housing as defined in claim 1 wherein said front wall has a top opening and a bottom opening, and wherein said adapter plate is secured to said front wall, said adapter plate having a plurality of windows therein exposing said input or output devices.

5. The housing as defined in claim 1 wherein said top wall and said base of said left side wall have openings for convection cooling of said components on said power supply circuit board.

6. The rack mountable housing as defined in claim 1, wherein said power supply circuit board assembly includes a plurality of connectors exposed through said front wall, said connectors providing a means for interconnecting said housing with other functional housing within a separate programmable logic controller rack assembly.

* * * * *